United States Patent
Sakata et al.

(10) Patent No.: US 10,923,614 B2
(45) Date of Patent: Feb. 16, 2021

(54) PHOTODIODE, PHOTODIODE ARRAY, AND SOLID-STATE IMAGING DEVICE

(71) Applicant: PANASONIC INTELLECTUAL PROPERTY MANAGEMENT CO., LTD., Osaka (JP)

(72) Inventors: Yusuke Sakata, Osaka (JP); Manabu Usuda, Hyogo (JP); Mitsuyoshi Mori, Kyoto (JP); Yutaka Hirose, Kyoto (JP); Yoshihisa Kato, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 823 days.

(21) Appl. No.: 15/328,648

(22) PCT Filed: Jul. 9, 2015

(86) PCT No.: PCT/JP2015/003453
§ 371 (c)(1),
(2) Date: Jan. 24, 2017

(87) PCT Pub. No.: WO2016/013170
PCT Pub. Date: Jan. 28, 2016

(65) Prior Publication Data
US 2017/0229599 A1    Aug. 10, 2017

(30) Foreign Application Priority Data
Jul. 25, 2014   (JP) .............................. JP2014-152269

(51) Int. Cl.
*H01L 31/107*    (2006.01)
*H01L 27/146*    (2006.01)
*H02S 40/44*     (2014.01)

(52) U.S. Cl.
CPC ...... *H01L 31/1075* (2013.01); *H01L 27/1461* (2013.01); *H01L 27/1464* (2013.01);
(Continued)

(58) Field of Classification Search
CPC ............... H01L 31/107; H01L 31/1075; H01L 27/14647; H01L 27/1461; H01L 27/1464;
(Continued)

(56) References Cited

U.S. PATENT DOCUMENTS

| | | | |
|---|---|---|---|
| 5,552,629 A * | 9/1996 | Watanabe | B82Y 20/00 257/186 |
| 2005/0258449 A1* | 11/2005 | Lutz | H01L 31/107 257/186 |

(Continued)

FOREIGN PATENT DOCUMENTS

| | | |
|---|---|---|
| CN | 101048878 A | 10/2007 |
| JP | 2009-004812 A | 1/2009 |

(Continued)

OTHER PUBLICATIONS

International Search Report and Written Opinion issued in International Patent Application No. PCT/JP2015/003453, dated Sep. 29, 2015; with partial English translation.

(Continued)

*Primary Examiner* — Stephen W Smoot
*Assistant Examiner* — Sun Mi Kim King
(74) *Attorney, Agent, or Firm* — McDermott Will and Emery LLP

(57) ABSTRACT

A photodiode that multiplies a charge generated by photoelectric conversion in an avalanche region includes: a p− type semiconductor layer having interfaces; an n+ type semiconductor region located inside the p− type semiconductor layer and in contact with the interface; an n+ type semiconductor region located inside the p− type semicon- (Continued)

ductor layer and connected to the n+ type semiconductor region; and a p type semiconductor region located between the n+ type semiconductor region and the interface, wherein the n+ type semiconductor region, the n+ type semiconductor region, and the p type semiconductor region each have a higher impurity concentration than the p– type semiconductor layer, the avalanche region is a region between the n+ type semiconductor region and the p type semiconductor region inside the p– type semiconductor layer, and the n+ type semiconductor region has a smaller area than the n+ type semiconductor region in planar view.

22 Claims, 6 Drawing Sheets

(52) U.S. Cl.
CPC .. *H01L 27/14609* (2013.01); *H01L 27/14636* (2013.01); *H01L 27/14643* (2013.01); *H01L 27/14647* (2013.01); *H01L 31/107* (2013.01); *H02S 40/44* (2014.12)

(58) Field of Classification Search
CPC ......... H01L 27/14609; H01L 27/14636; H01L 27/14643; H02S 40/44; Y02E 10/60; Y02E 10/50

See application file for complete search history.

(56) References Cited

U.S. PATENT DOCUMENTS

| 2008/0121867 | A1 | 5/2008 | Yagyu et al. |
| 2009/0152681 | A1 | 6/2009 | Zheng et al. |
| 2009/0256223 | A1 | 10/2009 | Yamamura et al. |
| 2015/0281620 | A1 | 10/2015 | Usuda et al. |

FOREIGN PATENT DOCUMENTS

| WO | 2008/004547 A1 | 1/2008 |
| WO | 2014/097519 A1 | 6/2014 |

OTHER PUBLICATIONS

Office Action issued in corresponding Chinese Patent Application No. 201580040471.8, dated Oct. 16, 2017, with partial English translation.

* cited by examiner

PHOTODIODE, PHOTODIODE ARRAY, AND SOLID-STATE IMAGING DEVICE

RELATED APPLICATIONS

This application is the U.S. National Phase under 35 U.S.C. § 371 of International Patent Application No. PCT/JP2015/003453, filed on Jul. 9, 2015, which in turn claims the benefit of Japanese Application No. 2014-152269, filed on Jul. 25, 2014, the disclosures of which applications are incorporated by reference herein.

TECHNICAL FIELD

The present disclosure relates to a photodiode, a photodiode array, and a solid-state imaging device, and particularly relates to a photodiode that detects weak light.

BACKGROUND ART

In recent years, avalanche photodiodes (hereafter, APDs) have been used to perform photon counting in the fields of medicine, biotechnology, chemistry, etc. An APD is a photodiode that multiplies signal charge generated by photoelectric conversion using avalanche breakdown to enhance detection sensitivity. A high-sensitive image sensor (Patent Literature (PTL) 1) and photon counting photodetector (PTL 2) using APDs have been devised.

CITATION LIST

Patent Literature

PTL 1: International Patent Application Publication No. 2014/097519
PTL 2: International Patent Application Publication No. 2008/004547

SUMMARY OF THE INVENTION

Technical Problem

To detect weak light by signal multiplication through avalanche breakdown, dark current is desirably lower than the amount of signal charge. Hence, photodetectors for weak light detection adopt measures to suppress dark current. In PTL 1, surface depletion is prevented to suppress surface dark current. However, this may weaken separability between pixels. In PTL 2, the region between a p+ type semiconductor layer and a separating part is p− type, and edge breakdown is suppressed. However, dark current increases because a depletion layer is formed across a wide area on the substrate surface.

The present disclosure has an object of providing a photodiode, photodiode array, and solid-state imaging device that minimize dark current.

Solution to Problem

To solve the problem stated above, a photodiode according to an aspect of the present disclosure is a photodiode that multiplies a charge generated by photoelectric conversion in an avalanche region, the photodiode including: a semiconductor layer having a first surface and a second surface that faces the first surface; a first semiconductor region located inside the semiconductor layer and in contact with the first surface; a second semiconductor region located inside the semiconductor layer and connected to the first semiconductor region; and a third semiconductor region located between the second semiconductor region and the second surface, wherein the semiconductor layer and the third semiconductor region are a first conductivity type, the first semiconductor region and the second semiconductor region are a second conductivity type opposite to the first conductivity type, the first semiconductor region, the second semiconductor region, and the third semiconductor region each have a higher impurity concentration than the semiconductor layer, the avalanche region is a region between the second semiconductor region and the third semiconductor region inside the semiconductor layer, and the first semiconductor region has a smaller area than the second semiconductor region in planar view.

Advantageous Effect of Invention

The photodiode according to the present disclosure can realize a high-sensitive photodetector with low dark current.

DESCRIPTION OF EXEMPLARY EMBODIMENTS

The following describes embodiments of a photodiode, photodiode array, and solid-state imaging device according to the present disclosure in detail, with reference to drawings. Substantially same structural elements are given the same reference signs, and their description may be omitted. The present disclosure is not limited to the following embodiments. Two or more embodiments of the present disclosure may be combined. Although the following embodiments describe an example where the first conductivity type is p type and the second conductivity type is n type, this does not exclude a structure in which p type and n type are reversed.

Embodiment 1

The structures of a photodiode and solid-state imaging device according to Embodiment 1 are described below, with reference to FIGS. 1 and 2.

Figure 1:
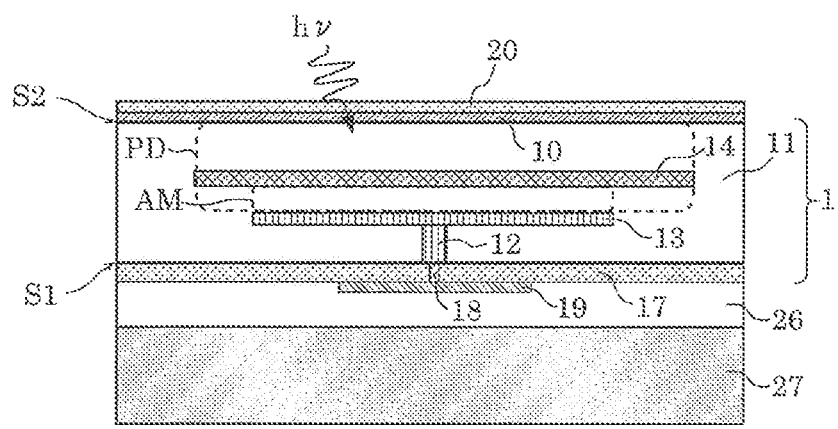
FIG. 1 is a sectional view of a photodetector including a photodiode according to Embodiment 1.
Figure 2:
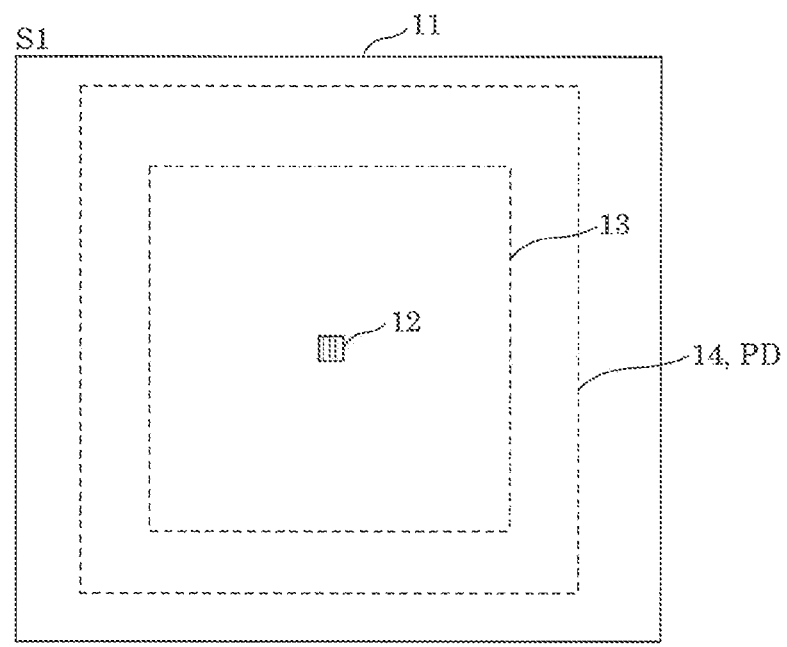
FIG. 2 is a plan view of the photodiode according to Embodiment 1.

FIG. 1 is a sectional view of a photodetector including a photodiode according to Embodiment 1. FIG. 2 is a plan view of the photodiode according to Embodiment 1. FIG. 2 is a partially transparent view to clearly show the layout of the photodiode in planar view. FIG. 2 is also a plan view in interface S1 illustrated in FIG. 1. In this description, "planar view" indicates a view in the direction normal to interfaces S1 and S2.

Photodiode 1 according to this embodiment includes: p− type semiconductor layer 11; n+ type semiconductor regions 12 and 13 located inside p− type semiconductor layer 11; and p type semiconductor region 14 located inside p− type semiconductor layer 11.

P− type semiconductor layer 11 is a semiconductor layer having interface S1 which is a first surface and interface S2 which is a second surface. Interfaces S1 and S2 face each other.

N+ type semiconductor region 12 is a first semiconductor region that has a higher impurity concentration than p− type semiconductor layer 11 and is in contact with interface S1.

N+ type semiconductor region 13 is a second semiconductor region that has a higher impurity concentration than p− type semiconductor layer 11 and is connected to n+ type semiconductor region 12.

P type semiconductor region 14 is a third semiconductor region that has a higher impurity concentration than p− type semiconductor layer 11 and is located between n+ type semiconductor region 13 and interface S2.

The region between n+ type semiconductor region 13 and p type semiconductor region 14 inside p− type semiconductor layer 11 is avalanche multiplication region AM.

In planar view, n+ type semiconductor region 12 has a smaller area than n+ type semiconductor region 13.

The photodetector including photodiode 1 is a solid-state imaging device including: interlayer insulating film 17 in contact with interface S1; wiring layer 19 electrically connected to n+ type semiconductor region 12; and contact plug 18 located in interlayer insulating film 17 and electrically connecting n+ type semiconductor region 12 and metal wiring 19. Contact plug 18 is, for example, made of metal containing tungsten (W). Metal wiring 19 is, for example, made of metal mainly containing any of Al, Cu, and Ti.

FIG. 1 is a sectional view in the case where the photodetector including photodiode 1 according to this embodiment is a backside-illumination photodetector. Here, "backside illumination" means irradiation from the interface S2 side from among interfaces S1 and S2 of p− type semiconductor layer 11. An example of the method of manufacturing the photodetector including photodiode 1 is as follows.

First, p− type semiconductor layer 11 is formed by epitaxial growth on a SOI substrate having p+ type semiconductor region 10 as a seed layer, a box layer, and a Si substrate.

Next, n+ type semiconductor regions 12 and 13 and p type semiconductor region 14 are formed in p− type semiconductor layer 11 by ion implantation.

Interlayer insulating film 17, contact plug 18, metal wiring 19, and interlayer insulating film 26 are then formed in order on the interface S1 side of p− type semiconductor layer 11.

Following this, interlayer insulating film 26 and semiconductor substrate 27 are joined together, and the Si substrate and box layer of the SOI substrate are removed by polishing or etching.

Lastly, transparent electrode 20 is formed on p+ type semiconductor region 10.

In the photodetector manufactured by the aforementioned manufacturing method, p type semiconductor region 14 is located inside p− type semiconductor layer 11 and is not exposed to interface S2. Meanwhile, p+ type semiconductor region 10 which is a seventh semiconductor region is located on interface S2. P+ type semiconductor region 10 has a higher impurity concentration than p− type semiconductor layer 11.

In this structure of the photodetector, when a reverse bias voltage is applied between p+ type semiconductor region 10 (p− type semiconductor layer 11) and n+ type semiconductor region 12, the region between n+ type semiconductor region 13 and p+ type semiconductor region 10 is depleted. As a result, photoelectric conversion region PD for photoelectrically converting incident photon (or photons, hereafter the same) hv expands to the range illustrated in FIG. 1. Further, when the electric field intensity of the region between p type semiconductor region 14 and n+ type semiconductor region 13 becomes a predetermined value or more, avalanche multiplication region AM appears. The predetermined value varies depending on the material and the distance between n+ type semiconductor region 13 and p type semiconductor region 14. For example, in the case where the material is silicon and the distance is about 0.5 μm to about 1.0 μm, the electric field intensity of avalanche multiplication region AM is about $4 \times 10^5$ V/cm.

In FIG. 1, when photon hv irradiated from the transparent electrode 20 side passes through transparent electrode 20 and p+ type semiconductor region 10 and reaches photoelectric conversion region PD, photon hv is absorbed to generate charge (electron-hole pair). The electron of the generated charge moves toward avalanche multiplication region AM and undergoes avalanche multiplication. The multiplied electron passes through n+ type semiconductor region 13 and n+ type semiconductor region 12, and is output to contact plug 18 in pulse form. The holes generated by photoelectric conversion or avalanche multiplication are discharged through transparent electrode 20.

Upon reading the multiplied electron from contact plug 18, dark current as noise needs to be lower than the signal amount of the multiplied electron. A main source of dark current is a depletion region formed on interface S1 having high defect density. In this embodiment, the depletion region on interface S1 appears at the boundary between n+ type semiconductor region 12 and p− type semiconductor layer 11. In this case, since n+ type semiconductor region 12 can be formed in a small area as compared with photoelectric conversion region PD as illustrated in FIG. 2, dark current can be reduced. Although n+ type semiconductor region 12 may be formed as small as possible, n+ type semiconductor region 12 may be formed in such a size and concentration that prevent a depletion layer from expanding to contact plug 18 even when a voltage is applied.

N+ type semiconductor region 13, on the other hand, may be formed in a wide area. Avalanche multiplication region AM is formed between n+ type semiconductor region 13 and p type semiconductor region 14. Accordingly, widening the area of n+ type semiconductor region 13 widens the region in which the charge generated in photoelectric conversion region PD is multiplied, thus improving the area capable of detecting photons. Here, even when n+ type semiconductor region 13 is widened, dark current generated from interface S1 does not increase unless n+ type semiconductor region 12 is widened. For example, n+ type semiconductor region 12 has a size of substantially a square of 100 nm to 10 μm on each side, and a concentration of $10^{17}$ cm$^{-3}$ to $10^{20}$ cm$^{-3}$. N+ type semiconductor region 13 has a size of substantially a square of 1 μm to 1 mm on each side, which is larger than n+ type semiconductor region 12.

Thus, when n+ type semiconductor region 13 has a wider area than n+ type semiconductor region 12, the S/N ratio for dark current generated from interface S1 is higher.

P type semiconductor region 14 may be wider than n+ type semiconductor region 13 in planar view. The electron of the signal charge generated by photoelectric conversion between p type semiconductor region 14 and interface S2 tends to flow toward the part of the highest potential in the positive direction in p type semiconductor region 14. If p type semiconductor region 14 is narrower than n+ type semiconductor region 13, the electron tends to flow through the peripheral part of p type semiconductor region 14 having low p type concentration and low electric field intensity. Charge that does not pass through avalanche multiplication region AM is unlikely to be avalanche multiplied, which causes lower photon detection efficiency. In the case where sufficient photon detection efficiency is ensured, p type semiconductor region 14 may be reduced with respect to n+ type semiconductor region 13. In this case, the electric field intensity around n+ type semiconductor region 13 is reduced, with it being possible to prevent edge breakdown in the peripheral part of n+ type semiconductor region 13.

A region with low impurity concentration may be provided between p type semiconductor region 14 and n+ type semiconductor region 13. In the case where a pn junction is formed with high-concentration p type and high-concentration n type, Zener breakdown tends to occur rather than avalanche breakdown. In other words, the probability of avalanche multiplication decreases, which may cause lower photon detection efficiency.

In the case where p type semiconductor region 14 is formed in excessively high concentration with excessive thickness, even when a reverse bias voltage is applied between p+ type semiconductor region 10 (p− type semiconductor layer 11) and n+ type semiconductor region 12, there is a possibility that the depletion layer extending from n+ type semiconductor region 13 stops at p type semiconductor region 14 and photoelectric conversion region PD is kept from extending toward interface S2. Accordingly, p type semiconductor region 14 may have at least such concentration that enables avalanche multiplication between p type semiconductor region 14 and n+ type semiconductor region 13, and may have such concentration and thickness that enable the depletion layer to extend over p type semiconductor region 14 toward interface S2. For example, p type semiconductor region 14 has a concentration of $10^{16}$ $cm^{-3}$ to $10^{18}$ $cm^{-3}$ and a thickness of 0.1 μm to 0.5 μm.

In the case where electric field concentration occurs in the peripheral part of n+ type semiconductor region 13 and dark current increases due to edge breakdown, an n type region of low concentration may be formed in the peripheral part of n+ type semiconductor region 13 to reduce the concentration of the peripheral part to thus weaken the electric field.

To suppress dark current generated from interface S1, a p type semiconductor region may be formed on interface S1 of p− type semiconductor layer 11, thus suppressing the depletion layer spreading around the n+ type semiconductor region. In such a case, an n− type or p− type electric field relaxation region may be provided around n+ semiconductor region 12 to prevent an intense electric field from being formed on interface S1 and causing edge breakdown.

P type semiconductor region 14 may be formed by epitaxial growth with impurity concentration being changed, in the process of forming p− type semiconductor layer 11 by epitaxial growth. Such a structure can reduce the defect density of avalanche multiplication region AM and suppress dark current generated from the inside of p type semiconductor region 14, as compared with the case where p type semiconductor region 14 is formed by ion implantation. In addition, the multiplied electron generated by the multiplication of dark current can be suppressed, too. In the case of forming p type semiconductor region 14 with a predetermined area, an n type impurity may be ion implanted around p type semiconductor region 14 formed by epitaxial growth, to optimize the impurity concentration.

N+ type semiconductor region 13 may be formed by epitaxial growth with dopant and impurity concentration being changed, in the process of forming p− type semiconductor layer 11 by epitaxial growth. Such a structure can reduce the defect density of avalanche multiplication region AM and suppress dark current generated from the inside of n+ type semiconductor region 13, as compared with the case where n+ type semiconductor region 13 is formed by ion implantation. In addition, the multiplied electron generated by the multiplication of dark current can be suppressed, too. In the case of forming n+ type semiconductor region 13 with a predetermined area, a p type impurity may be ion implanted around n+ type semiconductor region 13 formed by epitaxial growth, to optimize the impurity concentration.

The defect density can be reduced by either forming both p type semiconductor region 14 and n+ type semiconductor region 13 by epitaxial growth or forming only one of p type semiconductor region 14 and n+ type semiconductor region 13 by epitaxial growth. In the case of forming the region by epitaxial growth, the impurity concentration and the thickness are changed, and so an impurity may be added by ion implantation. To suppress defects by ion implantation in avalanche multiplication region AM, however, the impurity concentration may be set to predetermined concentration upon epitaxial growth.

Figure 3:
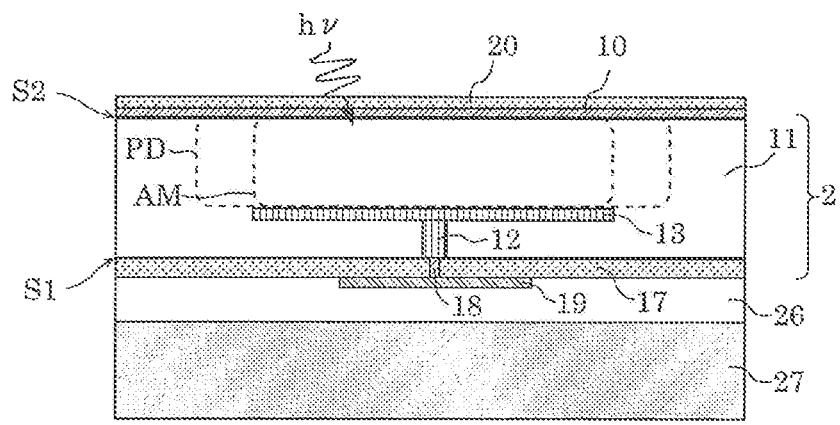
FIG. 3 is a sectional view of a photodetector including a photodiode according to a variation of Embodiment 1.

FIG. 3 is a sectional view of a photodetector including a photodiode according to a variation of Embodiment 1. Photodiode 2 has a structure in which p type semiconductor region 14 is not included and p+ type semiconductor region 10 is in contact with interface S2, as compared with FIG. 1. In this structure, when a predetermined reverse bias voltage is applied between p+ type semiconductor region 10 (p− type semiconductor layer 11) and n+ type semiconductor region 12, avalanche multiplication region AM is formed between p+ type semiconductor region 10 and n+ type semiconductor region 13. In this structure, too, the photon irradiated from the transparent electrode 20 side generates charge in photoelectric conversion region PD, and the charge undergoes avalanche multiplication in avalanche region AM. The structure in FIG. 3 thus has the same advantageous effects as that in FIG. 1.

In Embodiment 1, instead of the structure of the backside-illumination photodetector illustrated in FIG. 1, p− type semiconductor layer 11 may be formed on a p+ type semiconductor substrate, with photoelectric conversion region PD being irradiated with light from the interface S1 side. In this case, signal charge generated by photoelectric conversion on the interface S1 side of n+ type semiconductor region 13 is unlikely to pass through avalanche region AM, so that the photodetector may be used for the detection of red light or infrared light that is easily photoelectrically converted in photoelectric conversion region PD. Here, n+ type semiconductor region 12 may be located near the end of n+ type semiconductor region 13, to keep contact plug 18 and metal wiring 19 from overlapping photoelectric conversion region PD.

In this embodiment, the impurity concentration of p+ type semiconductor region 10 is $10^{17}$ cm$^{-3}$ to $10^{19}$ cm$^{-3}$ as an example. The impurity concentration of p− type semiconductor layer 11 is $10^{13}$ cm$^{-3}$ to $10^{16}$ cm$^{-3}$ as an example. The impurity concentration of n+ type semiconductor region 12 is $10^{17}$ cm$^{-3}$ to $10^{20}$ cm$^{-3}$ as an example. The impurity concentration of n+ type semiconductor region 13 is $10^{17}$ cm$^{-3}$ to $10^{19}$ cm$^{-3}$ as an example. The impurity concentration of p type semiconductor region 14 is $10^{16}$ cm$^{-3}$ to $10^{18}$ cm$^{-3}$ as an example.

Embodiment 2

The structures of a photodiode and solid-state imaging device according to this embodiment are described below, with reference to FIGS. 4 and 5.

Figure 4:
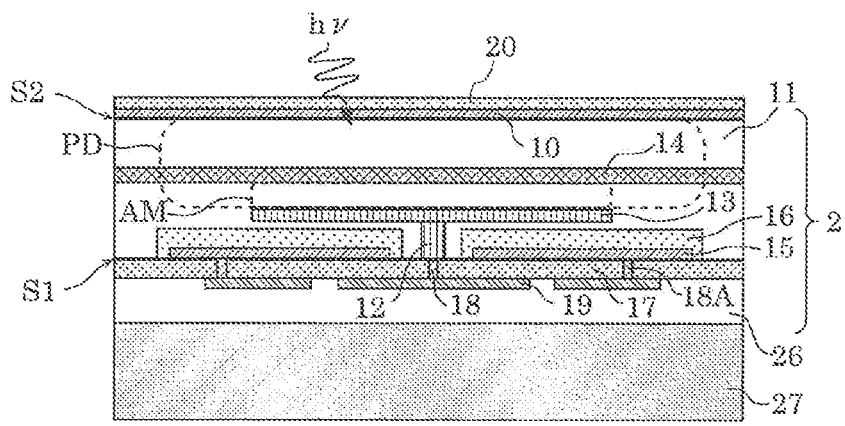
FIG. 4 is a sectional view of a photodetector including a photodiode according to Embodiment 2.

FIG. 4 is a sectional view of a photodetector including a photodiode according to Embodiment 2. FIG. 5 is a plan view of the photodiode according to Embodiment 2. FIG. 5 is a partially transparent view to clearly show the layout of the photodiode in planar view. FIG. 5 is also a plan view in interface S1 illustrated in FIG. 4.

Photodiode 2 according to Embodiment 2 differs from photodiode 1 according to Embodiment 1 in that it includes n+ type semiconductor region 15 having a higher impurity concentration than p− type semiconductor layer 11. The following mainly describes the differences from photodiode 1 according to Embodiment 1, while omitting the same features.

N+ type semiconductor region 15 is a fourth semiconductor region located inside p− type semiconductor layer 11, in contact with interface S1, and surrounding n+ type semiconductor region 12 in planar view.

Figure 5:
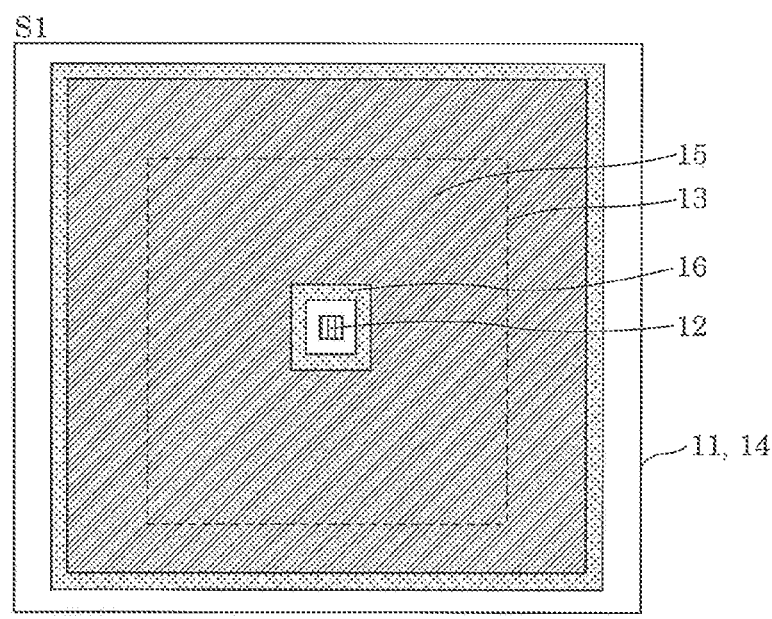
FIG. 5 is a plan view of the photodiode according to Embodiment 2.

As illustrated in FIG. 5, n+ type semiconductor region 15 surrounds n+ type semiconductor region 12. With this structure, most of the surface (interface S1) of p− type semiconductor layer 11 is covered by n+ type semiconductor region 15, with it being possible to minimize the area of the depletion layer on interface S1 from which dark current is generated. As a result, dark current (hole from electron-hole pair) flowing into p type semiconductor region 14 can be reduced. N+ type semiconductor region 15 may be as close to n+ type semiconductor region 12 as possible in the range where it is separated from n+ type semiconductor region 12, in order to reduce dark current caused by defects of the surface of p− type semiconductor layer 11.

On the other hand, if the surface of p− type semiconductor layer 11 is inactivated by forming a p type region with high concentration, applying a high electric field causes the generation of an intense electric field in a pn junction formed on the surface of interface S1 of p− type semiconductor layer 11, which increases dark current.

Photodiode 2 may further include p type semiconductor region 16 covering n+ type semiconductor region 15. P type semiconductor region 16 is a sixth semiconductor region located between n+ type semiconductor region 13 and n+ type semiconductor region 15, and is also a fifth semiconductor region located between n+ type semiconductor region 12 and n+ type semiconductor region 15. P type semiconductor region 16 has a higher impurity concentration than p− type semiconductor layer 11.

With this structure, conduction between n+ type semiconductor region 15 and n+ type semiconductor region 12 and between n+ type semiconductor region 15 and n+ type semiconductor region 13 can be prevented to suppress the leakage of the detected light signal. Moreover, separability between n+ type semiconductor region 15 and n+ type semiconductor region 12 is enhanced, and therefore the distance between n+ type semiconductor region 15 and n+ type semiconductor region 12 can be reduced. This reduces the area of the depletion layer formed on the surface of p− type semiconductor layer 11 around n+ type semiconductor region 12, and suppresses dark current caused by surface defects. Further, separability between n+ type semiconductor region 13 and n+ type semiconductor region 15 is enhanced, so that n+ type semiconductor region 13 can be placed at a shallow position from interface S1, i.e. the surface of p− type semiconductor layer 11. Thus, the spread of the concentration profile of n+ type semiconductor region 15 can be suppressed easily.

In addition, part of p− type semiconductor layer 11 is left as a region of a low impurity concentration, between p type semiconductor region 16 and n+ type semiconductor region 12. In other words, the region between p type semiconductor region 16 and n+ type semiconductor region 12 has a lower impurity concentration than p type semiconductor region 16. Hence, no steep pn junction is formed between n+ type semiconductor region 12 and p type semiconductor region 16, thus suppressing the flow of tunnel current through a surface defect.

In the case where tunnel current through a surface defect is negligible by weakening the electric field intensity near the surface of p− type semiconductor layer 11 by way of a measure such as lowering the concentration of p type semiconductor region 16, p type semiconductor region 16 may be in contact with n+ type semiconductor region 12 or be formed inside n+ type semiconductor region 12. As the manufacturing method in this case, after forming p type semiconductor region 16 on the surface of p− type semiconductor layer 11, n+ type semiconductor region 12 may be formed to cancel out p type semiconductor region 16 by ion implantation.

P type semiconductor region 16 is separated from n+ type semiconductor region 13, and is in contact with n+ type semiconductor region 15. In other words, p type semiconductor region 16 is closer to n+ type semiconductor region 15 than n+ type semiconductor region 13. This means that, for example in the case of forming p type semiconductor region 16 by ion implantation, the implantation depth of p type semiconductor region 16 is closer to that of n+ type semiconductor region 15 than that of n+ type semiconductor region 13. With such a structure, the electric field between p type semiconductor region 16 and n+ type semiconductor region 13 is relaxed, and an increase of dark current caused by an increase of electric field intensity can be prevented.

To induce avalanche multiplication, a reverse bias voltage may be applied between n+ type semiconductor region 12 and p+ type semiconductor region 10 (p− type semiconductor layer 11), and also a reverse bias voltage (first voltage) applied between n+ type semiconductor region 15 and p+ type semiconductor region 10 (p− type semiconductor layer 11). This enables the electrons in the dark current generated due to surface defects of the substrate surface to partly flow toward n+ type semiconductor region 15, so that dark current flowing into n+ type semiconductor region 12 can be reduced.

The absolute value of the reverse bias voltage (first voltage) applied between n+ type semiconductor region 15 and p+ type semiconductor region 10 (p− type semiconductor layer 11) may be greater than the absolute value of the reverse bias voltage (second voltage) applied between n+ type semiconductor region 12 and p+ type semiconductor region 10 (p− type semiconductor layer 11). This increases dark current flowing to n+ type semiconductor region 15, so that dark current flowing into n+ type semiconductor region 12 can be further reduced.

N+ type semiconductor region 15 is farther from p type semiconductor region 14 than n+ type semiconductor region 13. Accordingly, breakdown is unlikely to occur even when a high reverse bias voltage is applied, as compared with n+ type semiconductor region 12. Here, the voltage between n+ type semiconductor region 15 and n+ type semiconductor region 12 may be limited to such a level that enables electrical separation between n+ type semiconductor region 15 and n+ type semiconductor region 12 in dark time. Contact plug 18A for applying a voltage to n+ type semiconductor region 15 may be located so that no depletion occurs even when a voltage is applied, to suppress dark current flowing through n+ type semiconductor region 15.

As illustrated in FIG. 4, p type semiconductor region 14 may be formed uniformly in plane, in planar view. With this structure, the electron of the charge generated by photoelectric conversion between p type semiconductor region 14 and p+ type semiconductor region 10 easily flows toward n+ type semiconductor region 13 to which a reverse bias voltage is applied. The electron thus easily passes through avalanche multiplication region AM, which increases photon detection efficiency.

In this embodiment, the impurity concentration of p+ type semiconductor region 10 is $10^{17}$ cm$^{-3}$ to $10^{19}$ cm$^{-3}$ as an example. The impurity concentration of p− type semiconductor layer 11 is $10^{13}$ cm$^{-3}$ to $10^{16}$ cm$^{-3}$ as an example. The impurity concentration of n+ type semiconductor region 12 is $10^{17}$ cm$^{-3}$ to $10^{20}$ cm$^{-3}$ as an example. The impurity concentration of n+ type semiconductor region 13 is $10^{17}$ cm$^{-3}$ to $10^{19}$ cm$^{-3}$ as an example. The impurity concentration of p type semiconductor region 14 is $10^{16}$ cm$^{-3}$ to $10^{18}$ cm$^{-3}$ as an example. The impurity concentration of n+ type semiconductor region 15 is $10^{16}$ cm$^{-3}$ to $10^{18}$ cm$^{-3}$ as an example. The impurity concentration of p type semiconductor region 16 is $10^{16}$ cm$^{-3}$ to $10^{18}$ cm$^{-3}$ as an example.

Embodiment 3

The structures of a photodiode array and solid-state imaging device according to this embodiment are described below, with reference to FIGS. 6 and 7.

Figure 6:
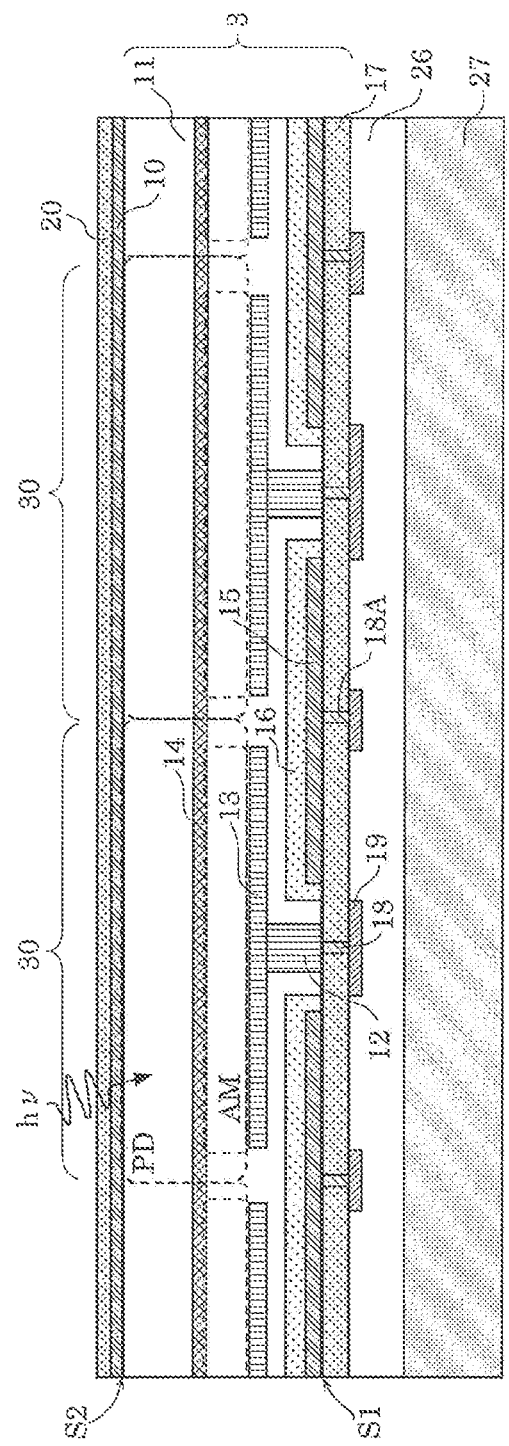
FIG. 6 is a sectional view of a photodetector including a photodiode array according to Embodiment 3.

FIG. 6 is a sectional view of a photodetector including a photodiode array according to Embodiment 3. FIG. 7 is a plan view of the photodiode array according to Embodiment 3. FIG. 7 is a plan view in interface S1 illustrated in FIG. 6.

Photodiode array 3 according to this embodiment includes plurality of pixels 30 each of which includes a photodiode. The photodiode includes: p− type semiconductor layer 11; n+ type semiconductor regions 12 and 13 located inside p− type semiconductor layer 11; and p type semiconductor region 14 located inside p− type semiconductor layer 11.

P− type semiconductor layer 11 is a semiconductor layer having interface S1 which is a first surface and interface S2 which is a second surface. Interfaces S1 and S2 face each other.

N+ type semiconductor region 12 is a first semiconductor region that has a higher impurity concentration than p− type semiconductor layer 11 and is in contact with interface S1.

N+ type semiconductor region 13 is a second semiconductor region that has a higher impurity concentration than p− type semiconductor layer 11 and is connected to n+ type semiconductor region 12.

P type semiconductor region 14 is a third semiconductor region that has a higher impurity concentration than p− type semiconductor layer 11 and is located between n+ type semiconductor region 13 and interface S2.

The region between n+ type semiconductor region 13 and p type semiconductor region 14 inside p− type semiconductor layer 11 is avalanche multiplication region AM.

In planar view, n+ type semiconductor region 12 has a smaller area than n+ type semiconductor region 13.

Each pixel 30 includes: interlayer insulating film 17 in contact with interface S1; metal wiring 19 electrically connected to n+ type semiconductor region 12; and contact plug 18 located in interlayer insulating film 17 and electrically connecting n+ type semiconductor region 12 and first metal wiring 19. Contact plug 18 is, for example, made of metal containing tungsten (W). Metal wiring 19 is, for example, made of metal mainly containing any of Al, Cu, and Ti. FIG. 6 is a sectional view in the case where the photodetector according to this embodiment is a backside-illumination photodetector. An example of the processing method is as follows.

First, p− type semiconductor layer 11 is formed by epitaxial growth on a SOI substrate having p+ type semiconductor region 10 as a seed layer, a box layer, and a Si substrate.

Next, n+ type semiconductor regions 12 and 13 and p type semiconductor region 14 are formed in p− type semiconductor layer 11 by ion implantation.

Interlayer insulating film 17, contact plug 18, metal wiring 19, and interlayer insulating film 26 are then formed in order on the interface S1 side of p− type semiconductor layer 11.

Following this, interlayer insulating film 26 and semiconductor substrate 27 are joined together, and the Si substrate and box layer of the SOI substrate are removed by polishing or etching.

Lastly, transparent electrode 20 is formed on p+ type semiconductor region 10.

In this structure, when a reverse bias voltage is applied between p+ type semiconductor region 10 (p− type semiconductor layer 11) and n+ type semiconductor region 12, the region between n+ type semiconductor region 13 and p+ type semiconductor region 10 is depleted. As a result, photoelectric conversion region PD for photoelectrically converting incident photon hv expands to the range illustrated in FIG. 6. Further, when the electric field intensity of the region between p type semiconductor region 14 and n+ type semiconductor region 13 becomes a predetermined value or more, avalanche multiplication region AM appears. The predetermined value varies depending on the material and the distance between n+ type semiconductor region 12 and p type semiconductor region 14. For example, in the case where the material is silicon and the distance is about 0.5 μm to about 1.0 μm, the electric field intensity of avalanche multiplication region AM is about $4 \times 10^5$ V/cm.

In FIG. 6, when photon hv irradiated from the transparent electrode 20 side passes through transparent electrode 20 and p+ type semiconductor region 10 and reaches photoelectric conversion region PD, photon hv is absorbed to generate charge (electron-hole pair). The electron of the generated charge moves toward avalanche multiplication region AM and undergoes avalanche multiplication. The multiplied electron passes through n+ type semiconductor region 13 and n+ type semiconductor region 12, and is output to contact plug 18. The holes generated by photoelectric conversion or avalanche multiplication are discharged through transparent electrode 20.

Upon reading the multiplied electron from contact plug 18, dark current as noise needs to be lower than the signal amount of the multiplied electron. A main source of dark current is a depletion region formed on interface S1 having high defect density. In this embodiment, the depletion region on interface S1 appears at the boundary between n+ type semiconductor region 12 and p− type semiconductor layer 11. In this case, since n+ type semiconductor region 12 can be formed in a small area as compared with photoelectric conversion region PD as illustrated in FIG. 7, dark current can be reduced. Although N+ type semiconductor region 12 may be formed as small as possible, n+ type semiconductor region 12 may be formed in such a size and concentration that prevent a depletion layer from expanding to contact plug 18 even when a voltage is applied.

N+ type semiconductor region 13, on the other hand, may be formed in a wide area. Avalanche multiplication region AM is formed between n+ type semiconductor region 13 and p type semiconductor region 14. Accordingly, widening the area of n+ type semiconductor region 13 widens the region in which the charge generated in photoelectric conversion region PD is multiplied, thus improving the area capable of detecting photons. Here, even when n+ type semiconductor region 13 is widened, dark current generated from interface S1 of the substrate does not increase unless n+ type semiconductor region 12 is widened. For example, n+ type semiconductor region 12 has a size of substantially a square of 100 nm to 10 μm on each side, and a concentration of $10^{17}$ $cm^{-3}$ to $10^{20}$ $cm^{-3}$. N+ type semiconductor region 13 has a size of substantially a square of 1 μm to 1 mm or more on each side, which is larger than n+ type semiconductor region 12.

Thus, when n+ type semiconductor region 13 has a wider area than n+ type semiconductor region 12, the S/N ratio for dark current generated from interface S1 is higher. Here, n+ type semiconductor region 13 may be separated so as not to electrically connect adjacent pixels. There is a possibility of crosstalk in the case where a signal leaks to n+ type semiconductor region 13 of an adjacent pixel during light signal detection. If the separation is difficult, a p type semiconductor region may be provided between n+ type semiconductor regions 13 of adjacent pixels.

A region with low impurity concentration may be provided between p type semiconductor region 14 and n+ type semiconductor region 13. In the case where a pn junction is formed with high-concentration p type and high-concentration n type, Zener breakdown tends to occur rather than avalanche breakdown. In other words, the probability of avalanche multiplication decreases, which may cause lower photon detection efficiency.

In the case where p type semiconductor region 14 is formed in excessively high concentration with excessive thickness, even when a reverse bias voltage is applied between p+ type semiconductor region 10 (p− type semiconductor layer 11) and n+ type semiconductor region 12, there is a possibility that the depletion layer extending from n+ type semiconductor region 13 stops at p type semiconductor region 14 and photoelectric conversion region PD is kept from extending toward interface S2. Accordingly, p type semiconductor region 14 may have such concentration and thickness that enable avalanche multiplication between p type semiconductor region 14 and n+ type semiconductor region 13 and enable the depletion layer to extend over p type semiconductor region 14 toward interface S2. For example, p type semiconductor region 14 has a concentration of $10^{16}$ $cm^{-3}$ to $10^{18}$ $cm^{-3}$.

In the case where electric field concentration occurs in the peripheral part of n+ type semiconductor region 13 and dark current increases due to edge breakdown, an n type region of low concentration may be formed in the peripheral part of n+ type semiconductor region 13 to reduce the concentration of the peripheral part to thus weaken the electric field.

To suppress dark current generated from interface S1, a p type semiconductor region may be formed on interface S1 of p− type semiconductor layer 11, thus suppressing the depletion layer spreading around the n+ type semiconductor region. In such a case, an n− type or p− type electric field relaxation region may be provided around n+ type semiconductor region 12 to prevent an intense electric field from being formed on interface S1 and causing edge breakdown.

N+ type semiconductor region 15 is formed in this embodiment. As illustrated in FIG. 7, n+ type semiconductor region 15 is a fourth semiconductor region located inside p− type semiconductor layer 11, in contact with interface S1, and surrounding n+ type semiconductor region 12 in planar view. With this structure, most of the surface of p− type semiconductor layer 11 is covered by n+ type semiconductor region 15, with it being possible to minimize the area of the depletion layer on interface S1 from which dark current is generated. As a result, dark current (hole from electron-hole pair) flowing into p type semiconductor region 14 can be reduced. N+ type semiconductor region 15 may be as close to n+ type semiconductor region 12 as possible in the range where it is separated from n+ type semiconductor region 12, in order to reduce dark current caused by defects of the substrate surface.

Figure 7:
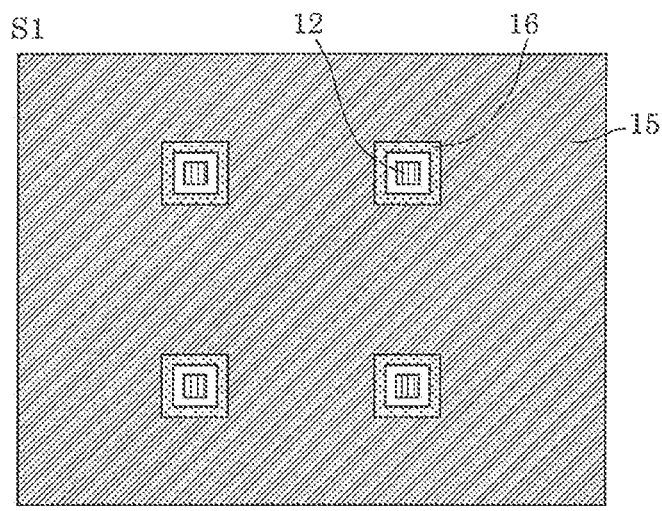
FIG. 7 is a plan view of the photodiode array according to Embodiment 3.

N+ type semiconductor region 15 is provided in common to plurality of pixels 30, as illustrated in FIG. 7. In the case where n+ type semiconductor region 15 is p type of high concentration, applying a high reverse bias voltage to induce avalanche multiplication causes the generation of an intense electric field in a pn junction on the substrate surface, which may increase dark current due to edge breakdown.

Photodiode array 3 further includes p type semiconductor region 16. P type semiconductor region 16 is a sixth semiconductor region located between n+ type semiconductor region 13 and n+ type semiconductor region 15, and is also a fifth semiconductor region located between n+ type semiconductor region 12 and n+ type semiconductor region 15. P type semiconductor region 16 has a higher impurity concentration than p− type semiconductor layer 11.

With this structure, conduction between n+ type semiconductor region 15 and n+ type semiconductor region 12 and between n+ type semiconductor region 15 and n+ type semiconductor region 13 can be prevented to suppress the leakage of the detected light signal. Moreover, separability between n+ type semiconductor region 15 and n+ type semiconductor region 12 is enhanced, and therefore the distance between n+ type semiconductor region 15 and n+ type semiconductor region 12 can be reduced. This reduces the area of the depletion layer formed on the surface of p− type semiconductor layer 11 around n+ type semiconductor region 12, and suppresses dark current caused by surface defects. Further, separability between n+ type semiconductor region 13 and n+ type semiconductor region 15 is enhanced, so that n+ type semiconductor region 13 can be formed at a shallow position from interface S1, i.e. the surface of p− type semiconductor layer 11. Thus, the spread of the concentration profile of n+ type semiconductor region 15 can be suppressed easily.

In addition, part of p− type semiconductor layer 11 is left as a region of a low impurity concentration, between p type semiconductor region 16 and n+ type semiconductor region 12. In other words, the region between p type semiconductor region 16 and n+ type semiconductor region 12 has a lower impurity concentration than p type semiconductor region 16.

Hence, no steep pn junction is formed between n+ type semiconductor region 12 and p type semiconductor region 16, thus suppressing the flow of tunnel current through a surface defect.

In the case where tunnel current is negligible by weakening the electric field intensity on the surface by, for example, lowering the concentration of p type semiconductor region 16, p type semiconductor region 16 may be in contact with n+ type semiconductor region 12. As the manufacturing method in this case, n+ type semiconductor region 12 may be formed by inverting p type semiconductor region 16 by ion implantation.

P type semiconductor region 16 is separated from n+ type semiconductor region 13, and is in contact with n+ type semiconductor region 15. In other words, p type semiconductor region 16 is closer to n+ type semiconductor region 15 than n+ type semiconductor region 13. This means that, for example in the case of forming p type semiconductor region 16 by ion implantation, the implantation depth of p type semiconductor region 16 is closer to that of n+ type semiconductor region 15 than that of n+ type semiconductor region 13. With such a structure, the electric field between p type semiconductor region 16 and n+ type semiconductor region 13 is relaxed, and an increase of dark current caused by an increase of electric field intensity can be prevented.

To induce avalanche multiplication, a reverse bias voltage may be applied between n+ type semiconductor region 12 and p+ type semiconductor region 10 (p− type semiconductor layer 11), and also a reverse bias voltage (first voltage) applied between n+ type semiconductor region 15 and p+ type semiconductor region 10 (p− type semiconductor layer 11). This enables the electrons in the dark current generated due to surface defects of the substrate surface to partly flow toward n+ type semiconductor region 15, so that dark current flowing into n+ type semiconductor region 12 can be reduced.

When the signal charge overflows during light detection, the signal can be flown into n+ type semiconductor region 15. This suppresses the leakage of the signal to n+ type semiconductor region 12 of the adjacent pixel. To achieve the effect, the potential barrier between n+ type semiconductor region 12 and n+ type semiconductor region 15 may be lower than the potential barrier between n+ type semiconductor region 12 and n+ type semiconductor region 12 of the adjacent pixel.

The reverse bias voltage (first voltage) applied between n+ type semiconductor region 15 and p+ type semiconductor region 10 (p− type semiconductor layer 11) may be higher than the reverse bias voltage (second voltage) applied between n+ type semiconductor region 12 and p+ type semiconductor region 10 (p− type semiconductor layer 11). This increases dark current flowing to n+ type semiconductor region 15, so that dark current flowing into n+ type semiconductor region 12 can be further reduced.

N+ type semiconductor region 15 is farther from p type semiconductor region 14 than n+ type semiconductor region 13. Accordingly, breakdown is unlikely to occur even when a higher reverse bias voltage than n+ type semiconductor region 12 is applied. Here, the voltage between n+ type semiconductor region 15 and n+ type semiconductor region 12 may be limited to such a level that enables separation between n+ type semiconductor region 15 and n+ type semiconductor region 12 in dark time. Contact plug 18A for applying a voltage to n+ type semiconductor region 15 may be located so that no depletion occurs even when a voltage is applied, to suppress dark current flowing through n+ type semiconductor region 15.

P type semiconductor region 14 may be wider than n+ type semiconductor region 13 in planar view. The electron of the signal charge generated by photoelectric conversion between p type semiconductor region 14 and interface S2 tends to flow toward the part of the highest potential in the positive direction in p type semiconductor region 14. If p type semiconductor region 14 is narrower than n+ type semiconductor region 13, the electron tends to flow through the peripheral part of p type semiconductor region 14 having low p type concentration and low electric field intensity. Charge that does not pass through avalanche multiplication region AM is unlikely to be avalanche multiplied, which causes lower photon detection efficiency. In the case where sufficient photon detection efficiency is ensured, p type semiconductor region 14 may be reduced with respect to n+ type semiconductor region 13. In this case, the electric field intensity around n+ type semiconductor region 13 is reduced, with it being possible to prevent edge breakdown in the peripheral part of n+ type semiconductor region 13.

As illustrated in FIG. 6, p type semiconductor region 14 is provided in common to plurality of pixels 30, and are formed uniformly in plane without being separated for each pixel 30 in planar view. With this structure, the electron of the charge generated by photoelectric conversion between p type semiconductor region 14 and p+ type semiconductor region 10 (p− type semiconductor layer 11) easily flows toward n+ type semiconductor region 13 to which a reverse bias voltage is applied. The electron thus easily passes through avalanche multiplication region AM, which increases photon detection efficiency.

P type semiconductor region 14 may be formed by epitaxial growth with impurity concentration being changed, in the process of forming p− type semiconductor layer 11 by epitaxial growth. Such a structure can reduce the defect density of avalanche multiplication region AM and suppress dark current generated from the inside of the substrate, as compared with the case where p type semiconductor region 14 is formed by ion implantation. In addition, the multiplied electron generated by the multiplication of dark current can be suppressed, too.

N+ type semiconductor region 13 may be formed by epitaxial growth with dopant and impurity concentration being changed, in the process of forming p− type semiconductor layer 11 by epitaxial growth. Such a structure can reduce the defect density of avalanche multiplication region AM and suppress dark current generated from the inside of the substrate, as compared with the case where n+ type semiconductor region 13 is formed by ion implantation. In addition, the multiplied electron generated by the multiplication of dark current can be suppressed, too.

In the case of forming n+ type semiconductor region 13 with a predetermined area, a p type impurity may be ion implanted around n+ type semiconductor region 13 formed by epitaxial growth to optimize the impurity concentration, thus separating the pixel from the adjacent pixel The defect density can be reduced by either forming both p type semiconductor region 14 and n+ type semiconductor region 13 by epitaxial growth or forming only one of p type semiconductor region 14 and n+ type semiconductor region 13 by epitaxial growth. In the case of forming the region by epitaxial growth, the impurity concentration and the thickness are changed, and so an impurity may be added by ion implantation. To suppress defects by ion implantation in avalanche multiplication region AM, however, the impurity concentration may be set to predetermined concentration upon epitaxial growth.

In this embodiment, instead of the backside-illumination photodetector illustrated in FIG. 6, p− type semiconductor layer 11 may be formed on a p+ type semiconductor substrate, with photoelectric conversion region PD being irradiated with light from the interface S1 side. In this case, signal charge generated by photoelectric conversion on the interface S1 side of n+ type semiconductor region 13 is unlikely to pass through avalanche region AM, so that the photodetector may be used for the detection of red light or infrared light that is easily photoelectrically converted in photoelectric conversion region PD. Here, n+ type semiconductor region 12 may be located near the end of n+ type semiconductor region 13, to keep contact plug 18 and metal wiring 19 from overlapping photoelectric conversion region PD.

In this embodiment, the impurity concentration of p+ type semiconductor region 10 is $10^{17}$ cm$^{-3}$ to $10^{19}$ cm$^{-3}$ as an example. The impurity concentration of p− type semiconductor layer 11 is $10^{13}$ cm$^{-3}$ to $10^{16}$ cm$^{-3}$ as an example. The impurity concentration of n+ type semiconductor region 12 is $10^{17}$ cm$^{-3}$ to $10^{20}$ cm$^{-3}$ as an example. The impurity concentration of n+ type semiconductor region 13 is $10^{17}$ cm$^{-3}$ to $10^{19}$ cm$^{-3}$ as an example. The impurity concentration of p type semiconductor region 14 is $10^{16}$ cm$^{-3}$ to $10^{18}$ cm$^{-3}$ as an example. The impurity concentration of n+ type semiconductor region 15 is $10^{16}$ cm$^{-3}$ to $10^{18}$ cm$^{-3}$ as an example. The impurity concentration of p type semiconductor region 16 is $10^{16}$ cm$^{-3}$ to $10^{18}$ cm$^{-3}$ as an example.

Embodiment 4

The photodiode or photodiode array according to each of Embodiments 1 to 3 may be used in a solid-state imaging device. The structure of a solid-state imaging device according to Embodiment 4 is described below, with reference to FIGS. 8 and 9.

Figure 8:
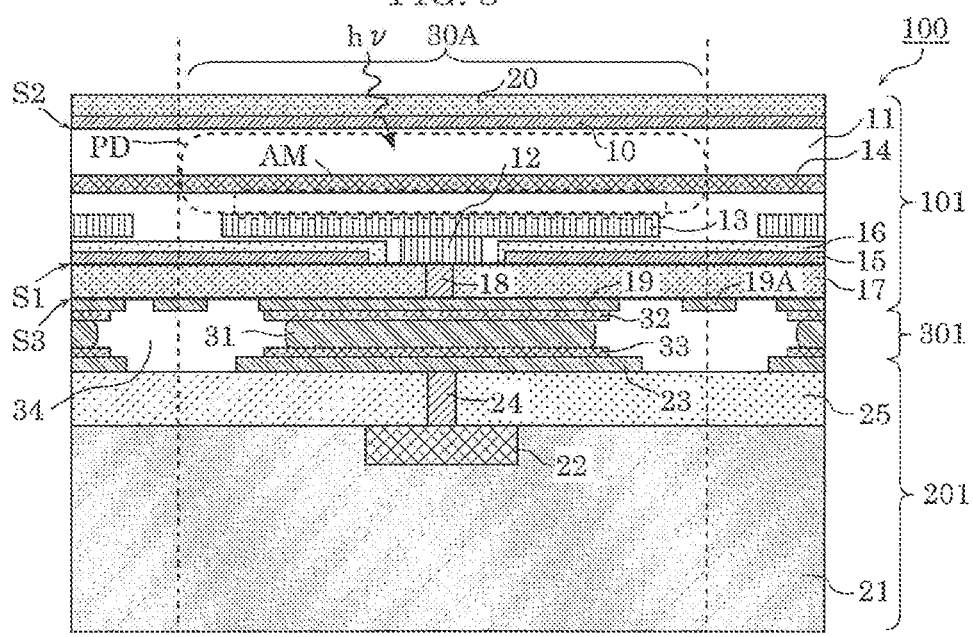
FIG. 8 is a sectional view of a solid-state imaging device according to Embodiment 4.
Figure 9:
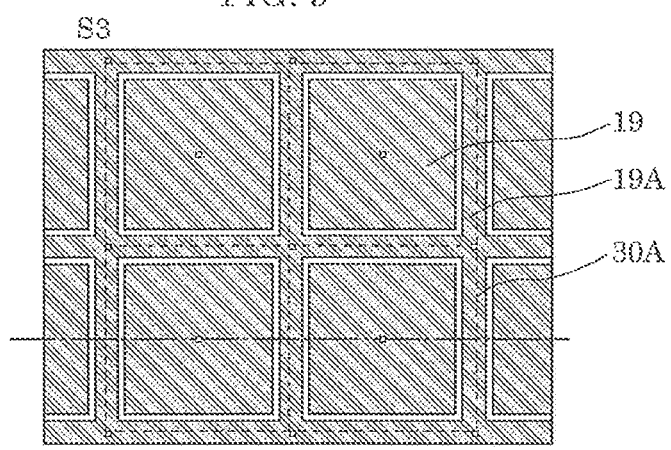
FIG. 9 is a plan view of the solid-state imaging device according to Embodiment 4.

FIG. 8 is a sectional view of the solid-state imaging device according to Embodiment 4. FIG. 9 is a plan view of the solid-state imaging device according to Embodiment 4. FIG. 9 is a plan view in interface S3 in FIG. 8.

Solid-state imaging device 100 according to this embodiment has plurality of pixels 30A arranged in a matrix on semiconductor substrate 21. Plurality of pixels 30A each include photoelectric conversion part 101, detection circuit part 201, and joining part 301. Photoelectric conversion part 101 is electrically connected to detection circuit part 201.

Photoelectric conversion part 101 is photodiode array 3 in Embodiment 3. As illustrated in FIG. 9, metal wiring 19 is electrically insulated from the adjacent pixel, and electrically connected to detection circuit part 201. Metal wiring 19A is electrically connected to the adjacent pixel, and arranged so that the same voltage can be applied in all pixels 30A.

Detection circuit part 201 includes p type semiconductor substrate 21, n− type charge accumulation part 22, metal wiring 23, contact plug 24, and wiring interlayer film 25 which is an insulation film. Charge accumulation part 22 is located inside semiconductor substrate 21, and accumulates the signal charge from photoelectric conversion part 101. Metal wiring 23 is wiring on the photoelectric conversion part 101 side surface of charge accumulation part 22. Contact plug 24 electrically connects charge accumulation part 22 and metal wiring 23.

Detection circuit part 201 includes the below-mentioned reset circuit and the like, although the circuit and the like are not illustrated for simplicity's sake. Metal wiring 23 is, for example, made of metal mainly containing any of Al, Cu, and Ti. Contact plug 24 is, for example, made of metal containing W.

Joining part 301 electrically connects photoelectric conversion part 101 and detection circuit part 201. Joining part 301 includes joining bump metal 31, joining underlying metal 32 located on the photoelectric conversion part 101 side, and joining underlying metal 33 located on the detection circuit part 201 side. Joining bump metal 31 is, for example, made of an alloy of tin (Sn) and silver (Ag). The alloy has a low melting point of 220° C., and so can join photoelectric conversion part 101 and detection circuit part 201 at low temperature. Therefore, photoelectric conversion part 101 and detection circuit part 201 are unlikely to be adversely affected by temperature during joining. Joining bump metal 31 may be an alloy containing Au. The alloy can easily form bumps at a narrow pitch by plating or vapor deposition, and so is suitable for joining photoelectric conversion part 101 and detection circuit part 201 which are a narrow-pitch pixel array.

The space surrounded by photoelectric conversion part 101, detection circuit part 201, and joining part 301 is filled with resin 34. In the case where the space is filled with resin 34 or the like, solid-state imaging device 100 has higher strength than in the case where the space is not filled with resin 34 or the like. The space may be not filled with resin 34 or the like.

When the electric field intensity of the region between n+ type semiconductor region 13 and p type semiconductor region 14 becomes a predetermined value or more, avalanche multiplication region AM appears. The predetermined value varies depending on the material and the distance between n+ type semiconductor region 13 and p type semiconductor region 14. For example, in the case where the material is silicon and the distance is about 0.5 μm to about 1.0 μm, the electric field intensity of avalanche multiplication region AM is about $4 \times 10^5$ V/cm.

Photon hv irradiated from above photoelectric conversion part 101 passes through transparent electrode 20 and p+ type semiconductor region 10 and reaches p− type semiconductor layer 11. Photon hv is then absorbed in p− type semiconductor layer 11 to generate charge (electron-hole pair). The electron of the generated charge moves toward avalanche multiplication region AM and undergoes avalanche multiplication. The multiplied electron passes through n+ type semiconductor region 13 and n+ type semiconductor region 12, and is output to the detection circuit part 201 side. The holes generated by photoelectric conversion or avalanche multiplication are discharged through transparent electrode 20.

Dark current on the substrate surface which can become noise is generated in the depletion layer formed around n+ type semiconductor region 12. With this structure, dark current caused by defects on the substrate surface can be minimized because the area of the depletion layer on the surface of p− type semiconductor layer 11 is reduced and dark current is absorbed using n+ type semiconductor region 15, as disclosed in Embodiment 3. Moreover, by forming at least one of p type semiconductor region 14 and n+ type semiconductor region 13 by low-defect epitaxial growth, dark current caused by defects inside the substrate can be reduced, too.

Although this embodiment employs electron reading method of reading the electron of the electron-hole pair generated in photoelectric conversion part 101 as signal charge, this is not a limitation. Hole reading method of reading the hole as signal charge may be employed by interchanging p type and n type and changing the voltage conditions.

Figure 10:
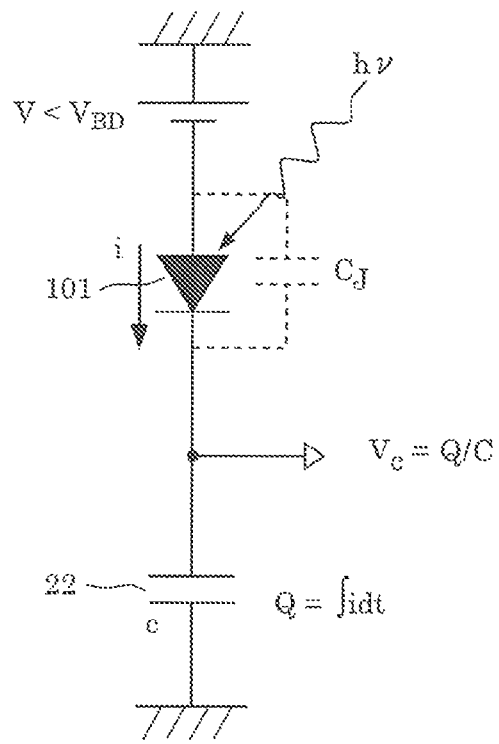
FIG. 10 is an equivalent circuit diagram of the solid-state imaging device according to Embodiment 4.

The following describes the signal detection method of the solid-state imaging device according to this embodiment, with reference to FIG. 10.

FIG. 10 is an equivalent circuit diagram of the solid-state imaging device according to Embodiment 4. In FIG. 10, when light enters photoelectric conversion part 101, signal charge is generated in photoelectric conversion part 101, and multiplied current i flows responsively. Charge Q=∫idt is accumulated in charge accumulation part 22 which is a capacitor. The accumulated charge is detected as voltage change Q/C, where C is the capacitance of charge accumulation part 22. Forming charge accumulation part 22 with low capacitance C using fine processing technology can increase voltage change Q/C. For example, suppose the pixel size is 25 µm×25 µm, the size of charge accumulation part 22 is 10 µm×10 µm, and the thickness (the length of one side in the direction perpendicular to the light receiving surface of photoelectric conversion part 101) of charge accumulation part 22 is 1 µm. Then, capacitance C is approximately 10 fF. In linear mode operation of driving with a voltage lower than breakdown voltage $V_{BD}$, when the multiplication factor of photoelectric conversion part 101 is 100 times, the amount of charge after one photon is incident and signal charge is generated and multiplied is Q=1.6×10$^{-17}$[C]. Hence, the voltage change in charge accumulation part 22 is output as a detectable value of $V_c$=Q/C=1.6 [mV]. By detecting the signal charge from photoelectric conversion part 101 using the capacity load detection circuit in this way, weak light can be detected even with low voltage drive.

In solid-state imaging device 100 according to this embodiment, false detection of signal charge from photoelectric conversion part 101 can be reduced by suppressing dark current on the substrate surface. In addition, by suppressing dark current inside the substrate, the generation of false signal charge as a result of the multiplication of dark current can be prevented. Further, even signal charge with low multiplication factor is detectable. Such solid-state imaging device 100 has a significantly improved S/N ratio.

Figure 11:
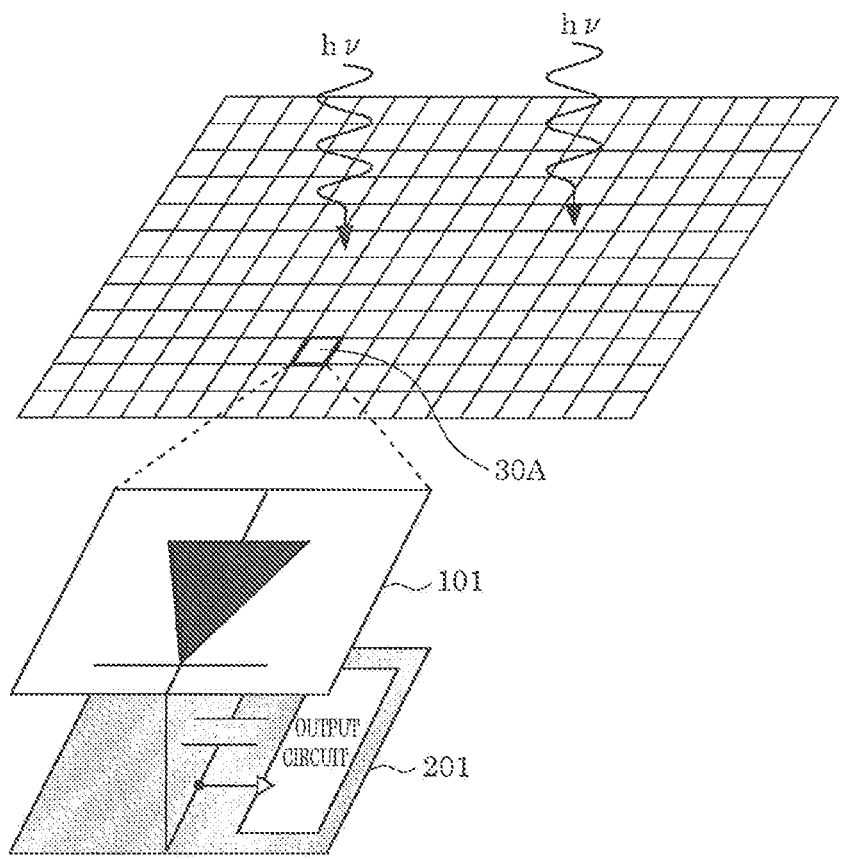
FIG. 11 is a conceptual diagram illustrating the integration of the solid-state imaging device according to Embodiment 4.

The following describes the integration of solid-state imaging device 100 according to this embodiment, with reference to FIG. 11.

FIG. 11 is a conceptual diagram illustrating the integration of the solid-state imaging device according to Embodiment 4. As illustrated in FIG. 11, pixels 30A each having the structure in which photoelectric conversion part 101 is stacked on capacity load-type detection circuit part 201 are arranged in a matrix. With this structure, the area of the pixel region can be increased because there is no need to place detection circuit part 201 outside the pixel region.

Moreover, the light detection data of plurality of pixels 30A adjacent to each other may be added up to average each of the signal (S) and noise (N) levels and relatively compensate the S/N ratio. This eliminates the need to compensate the S/N ratio by synchronizing with the light source as in conventional techniques. Solid-state imaging device 100 according to this embodiment thus can detect random light.

Embodiment 5

This embodiment describes a photodiode array having a high noise reduction effect.

Figure 12:
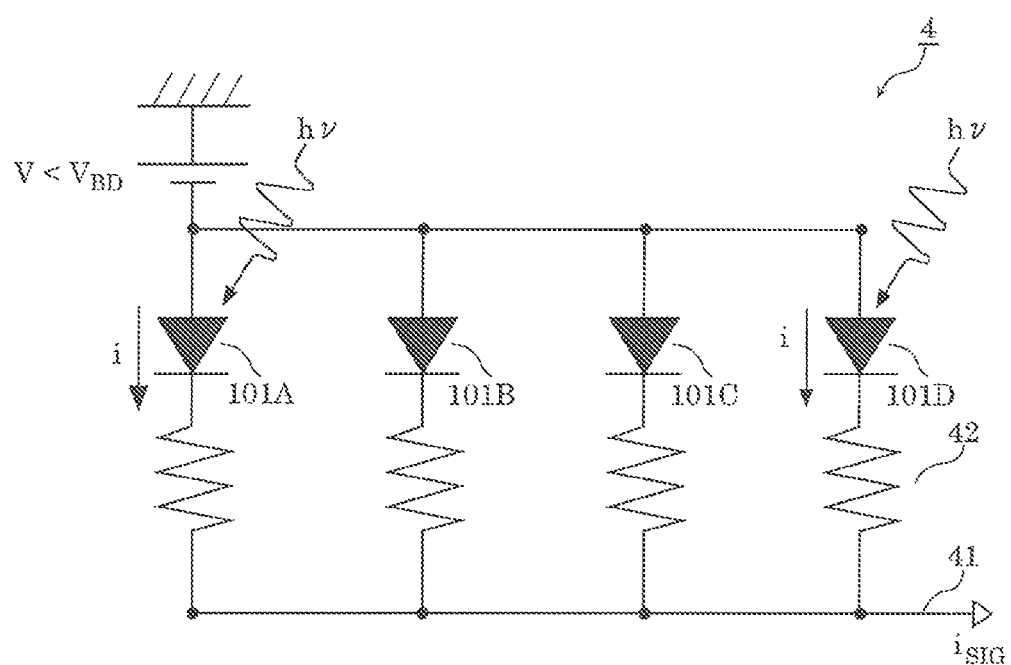
FIG. 12 is an equivalent circuit diagram of a photodiode array according to Embodiment 5.

FIG. 12 is an equivalent circuit diagram of the photodiode array according to Embodiment 5. FIG. 12 illustrates an equivalent circuit in the case where four pixels are arranged in an array, as an example.

Photodiode array 4 according to this embodiment has a structure in which, in photodiode array 3 according to Embodiment 3 in FIG. 6, n+ type semiconductor region 12 is connected to signal line 41 via resistor 42 having the same resistance in each pixel 30. Such a structure can suppress variation in peak value during light detection between pixels. Hence, the number of photons incident simultaneously can be identified from the peak value of the current flowing through signal line 41 upon light irradiation.

For example, in the case where photon hv enters photoelectric conversion parts 101A and 101D, the peak value of current ism flowing through signal line 41 is the sum of the peak values in photoelectric conversion parts 101A and 101D, i.e. the height twice the peak when detecting one photon, with it being possible to identify the detection of two photons from the peak.

With the structure of photodiode array 4 according to this embodiment, output fluctuation due to dark current can be suppressed by reducing dark current on the substrate surface. This enables accurate peak value identification. With this structure, the S/N ratio is determined from the peak value and the dark current. Here, since the dark current is determined by the sum of all pixels, the noise reduction effect by suppressing the dark current is high. Resistor 42 is made of polysilicon as an example.

Advantageous Effects, Etc.

As described above, one aspect of a photodiode according to the foregoing embodiments is photodiode 1 that multiplies a charge generated by photoelectric conversion in an avalanche region, photodiode 1 including: p− type semiconductor layer 11 having interface S1 and interface S2 that faces interface S1; n+ type semiconductor region 12 located inside p− type semiconductor layer 11 and in contact with interface S1; n+ type semiconductor region 13 located inside p− type semiconductor layer 11 and connected to n+ type semiconductor region 12; and p type semiconductor region 14 located between n+ type semiconductor region 13 and interface S2, wherein n+ type semiconductor region 12, n+ type semiconductor region 13, and p type semiconductor region 14 each have a higher impurity concentration than p− type semiconductor layer 11, the avalanche region is a region between n+ type semiconductor region 13 and p type semiconductor region 14 inside p− type semiconductor layer 11, and n+ type semiconductor region 12 has a smaller area than n+ type semiconductor region 13 in planar view.

With this structure, the depletion layer on the substrate surface is formed only around n+ type semiconductor region 12, so that the amount of dark current as noise depends on the size of n+ type semiconductor region 12 having a small area. Moreover, the region in which avalanche multiplication necessary for photon detection occurs depends on the area of the region between n+ type semiconductor region 13 and p type semiconductor region 14 having a large area. Hence, the area of the dark current source on the surface of the semiconductor layer is limited to a small area with respect to the area of the avalanche multiplication region, and dark current can be reduced as compared with conventional techniques.

The depletion region in interface S1 appears at the boundary between n+ type semiconductor region 12 and p− type semiconductor layer 11. In this case, since n+ type semiconductor region 12 has a small area with respect to photoelectric conversion region PD, dark current can be reduced. A high-sensitive photodetector with low dark current can thus be realized.

Photodiode 2 may further include n+ type semiconductor region 15 located inside p− type semiconductor layer 11, in contact with interface S1, and surrounding n+ type semiconductor region 12 in planar view.

With this structure, most of the surface (interface S1) of p− type semiconductor layer 11 is covered by n+ type semiconductor region 15, with it being possible to minimize the area of the depletion layer on interface S1 from which dark current is generated. As a result, dark current (hole from electron-hole pair) flowing into p type semiconductor region 14 can be reduced.

Photodiode 2 may further include p type semiconductor region 16 located between p type semiconductor region 14 and n+ type semiconductor region 12, wherein p type semiconductor region 16 has a higher impurity concentration than p− type semiconductor layer 11.

With this structure, conduction between n+ type semiconductor region 15 and n+ type semiconductor region 12 can be prevented to suppress the leakage of the detected light signal. Moreover, separability between n+ type semiconductor region 15 and n+ type semiconductor region 12 is enhanced, and therefore the distance between n+ type semiconductor region 15 and n+ type semiconductor region 12 can be reduced. This reduces the area of the depletion layer formed on the surface of p− type semiconductor layer 11 around n+ type semiconductor region 12, and suppresses dark current caused by surface defects.

A region between p type semiconductor region 16 and n+ type semiconductor region 12 may have a lower impurity concentration than p type semiconductor region 16.

With this structure, no steep pn junction is formed between n+ type semiconductor region 12 and p type semiconductor region 16, thus suppressing the flow of tunnel current through a surface defect.

Photodiode 2 may further include p type semiconductor region 16 located between n+ type semiconductor region 15 and n+ type semiconductor region 13, wherein p type semiconductor region 16 has a higher impurity concentration than p− type semiconductor layer 11.

With this structure, conduction between n+ type semiconductor region 15 and n+ type semiconductor region 13 can be prevented to suppress the leakage of the detected light signal.

P type semiconductor region 16 may be closer to n+ type semiconductor region 15 than n+ type semiconductor region 13.

With this structure, the electric field between p type semiconductor region 16 and n+ type semiconductor region 13 is relaxed, and an increase of dark current caused by an increase of electric field intensity can be prevented.

A first voltage of reverse bias may be applied between n+ type semiconductor region 15 and p− type semiconductor layer 11.

With this structure, the electrons in the dark current generated due to surface defects of the substrate surface are partly flown toward n+ type semiconductor region 15, so that dark current flowing into n+ type semiconductor region 12 can be reduced.

A second voltage of reverse bias may be applied between n+ type semiconductor region 12 and p− type semiconductor layer 11, and the first voltage may be higher than the second voltage.

With this structure, dark current flowing to n+ type semiconductor region 15 increases, so that dark current flowing into n+ type semiconductor region 12 can be further reduced.

P type semiconductor region 14 may be located inside p− type semiconductor layer 11, and have a wider area than n+ type semiconductor region 13 in planar view.

With this structure, the electron passes through avalanche multiplication region AM. This makes the charge more likely to be avalanche multiplied, so that photon detection efficiency is improved.

P type semiconductor region 14 may be formed continuously with p− type semiconductor layer 11 by crystal growth.

With this structure, the defect density of avalanche multiplication region AM is reduced to suppress dark current generated from the inside of p type semiconductor region 14, as compared with the case where p type semiconductor region 14 is formed by ion implantation. In addition, the multiplied electron generated by the multiplication of dark current can be suppressed, too.

N+ type semiconductor region 13 may be formed continuously with p− type semiconductor layer 11 by crystal growth.

With this structure, the defect density of avalanche multiplication region AM is reduced to suppress dark current generated from the inside of n+ type semiconductor region 13, as compared with the case where n+ type semiconductor region 13 is formed by ion implantation.

Light may be applied from a side on which interface S2 is located from among interface S1 and interface S2.

P type semiconductor region 14 may be located inside p− type semiconductor layer 11, and be not exposed to interface S2, photodiode 2 may further include p+ type semiconductor region 10 located on interface S2, and p+ type semiconductor region 10 may have a higher impurity concentration than p− type semiconductor layer 11.

With this structure, most of the surface of p− type semiconductor layer 11 is covered by n+ type semiconductor region 15, with it being possible to minimize the area of the depletion layer on interface S1 from which dark current is generated. As a result, dark current (hole from electron-hole pair) flowing into p type semiconductor region 14 can be reduced.

Photodiode 2 may further include: resistor 42 electrically connected to n+ type semiconductor region 13; and signal line 41 connected to n+ type semiconductor region 13 via resistor 42.

With this structure, variation in peak value during light detection between pixels is suppressed. Hence, the number of photons incident simultaneously can be identified from the peak value of the current flowing through signal line 41 upon light irradiation.

Photodiode array 3 according to the foregoing embodiments may include plurality of pixels 30 each of which has the aforementioned photodiode.

With this structure, the depletion region in interface S1 appears at the boundary between n+ type semiconductor region 12 and p− type semiconductor layer 11. In this case, since n+ type semiconductor region 12 has a small area with respect to photoelectric conversion region PD, dark current can be reduced. A high-sensitive photodetector with low dark current can thus be realized.

P type semiconductor region 14 may be provided in common to plurality of pixels 30.

With this structure, the electron of the charge generated by photoelectric conversion between p type semiconductor region 14 and p+ type semiconductor region 10 (p− type semiconductor layer 11) easily flows toward n+ type semiconductor region 13 to which a reverse bias voltage is applied. The electron thus easily passes through avalanche multiplication region AM, which increases photon detection efficiency.

N+ type semiconductor region 15 may be provided in common to plurality of pixels 30.

N+ type semiconductor region 13 may be separated for each of plurality of pixels 30 by ion implanting a p type impurity.

A solid-state imaging device may include: the aforementioned photodiode or photodiode array; charge accumulation part 22 electrically connected to n+ type semiconductor region 12 and accumulating the charge multiplied in the avalanche region; and a detection circuit that detects the charge accumulated in charge accumulation part 22.

OTHER EMBODIMENTS

Although the photodiode, photodiode array, and solid-state imaging device according to the embodiments of the present disclosure have been described above, the present disclosure is not limited to Embodiments 1 to 5.

For example, at least part of the functions of the photodiode, photodiode array, and solid-state imaging device according to Embodiments 1 to 5 may be combined.

The numeric values described above are mere examples to illustrate the present disclosure in detail, and the present disclosure is not limited to such.

The materials of the structural elements described above are mere examples to illustrate the present disclosure in detail, and the present disclosure is not limited to such. The connecting relations between the structural elements described above are mere examples to illustrate the present disclosure in detail, and the present disclosure is not limited to such.

Various modifications conceivable by a person skilled in the art to the embodiments are also included in the present disclosure within the scope of the present disclosure.

INDUSTRIAL APPLICABILITY

A photodiode according to the present disclosure can be used in a high-sensitive photodetector for detecting a single photon, a high-sensitive solid-state imaging device, etc.

The invention claimed is:

1. A photodiode that multiplies a charge generated by photoelectric conversion in an avalanche region, the photodiode comprising:
    a semiconductor layer including silicon, the semiconductor layer having a first surface and a second surface that faces the first surface;
    a first semiconductor region located inside the semiconductor layer and in contact with the first surface;
    a second semiconductor region located inside the semiconductor layer and connected to the first semiconductor region; and
    a third semiconductor region located between the second semiconductor region and the second surface,
    wherein the semiconductor layer and the third semiconductor region are a first conductivity type,
    the first semiconductor region and the second semiconductor region are a second conductivity type opposite to the first conductivity type,
    the first semiconductor region, the second semiconductor region, and the third semiconductor region each have a higher impurity concentration than the semiconductor layer,
    the avalanche region is a region between the second semiconductor region and the third semiconductor region inside the semiconductor layer,
    the first semiconductor region has a smaller area than the second semiconductor region in planar view, and
    the second semiconductor region is disposed further from the first surface than the first semiconductor region in a thickness direction of the photodiode.

2. The photodiode according to claim 1, further comprising:
    a fourth semiconductor region of the second conductivity type located inside the semiconductor layer, in contact with the first surface, and surrounding the first semiconductor region in planar view.

3. The photodiode according to claim 2, further comprising:
    a fifth semiconductor region of the first conductivity type located between the fourth semiconductor region and the first semiconductor region,
    wherein the fifth semiconductor region has a higher impurity concentration than the semiconductor layer.

4. The photodiode according to claim 3,
    wherein a region between the fifth semiconductor region and the first semiconductor region has a lower impurity concentration than the fifth semiconductor region.

5. The photodiode according to claim 2, further comprising:
    a sixth semiconductor region of the first conductivity type located between the fourth semiconductor region and the second semiconductor region,
    wherein the sixth semiconductor region has a higher impurity concentration than the semiconductor layer.

6. The photodiode according to claim 5,
    wherein the sixth semiconductor region is closer to the fourth semiconductor region than the second semiconductor region.

7. The photodiode according to claim 2,
    wherein a first voltage of reverse bias is applied between the fourth semiconductor region and the semiconductor layer.

8. The photodiode according to claim 7,
    wherein a second voltage of reverse bias is applied between the first semiconductor region and the semiconductor layer, and
    the first voltage is higher than the second voltage.

9. The photodiode according to claim 1,
    wherein the third semiconductor region is located inside the semiconductor layer, and has a wider area than the second semiconductor region in planar view.

10. The photodiode according to claim 1,
    wherein the third semiconductor region is formed continuously with the semiconductor layer by crystal growth.

11. The photodiode according to claim 1,
    wherein the second semiconductor region is formed continuously with the semiconductor layer by crystal growth.

12. The photodiode according to claim 1,
    wherein light is applied from a side on which the second surface is located from among the first surface and the second surface.

13. The photodiode according to claim 1,
wherein the third semiconductor region is located inside the semiconductor layer, and is not exposed to the second surface,
the photodiode further comprises
a seventh semiconductor region of the first conductivity type located on the second surface, and
the seventh semiconductor region has a higher impurity concentration than the semiconductor layer.

14. The photodiode according to claim 1, further comprising:
a resistor electrically connected to the first semiconductor region; and
a signal line connected to the first semiconductor region via the resistor.

15. A photodiode array comprising:
a plurality of pixels each of which has the photodiode according to claim 1.

16. The photodiode array according to claim 15,
wherein the third semiconductor region is provided in common to the plurality of pixels.

17. A photodiode array comprising:
a plurality of pixels each of which has the photodiode according to claim 2,
wherein the fourth semiconductor region is provided in common to the plurality of pixels.

18. The photodiode array according to claim 15,
wherein the second semiconductor region is separated for each of the plurality of pixels by ion implanting an impurity of the first conductivity type.

19. A solid-state imaging device comprising:
the photodiode according to claim 1;
a charge accumulation part electrically connected to the first semiconductor region and accumulating the charge multiplied in the avalanche region; and
a detection circuit that detects the charge accumulated in the charge accumulation part.

20. The photodiode according to claim 1, wherein the first semiconductor region and the second semiconductor region directly contact each other.

21. The photodiode according to claim 1, wherein the second semiconductor region does not directly contact the first surface.

22. The photodiode according to claim 1, further comprising:
a semiconductor substrate,
a first interlayer insulating film disposed on the semiconductor substrate,
a second interlayer insulating film disposed on the first interlayer insulating film,
a wiring layer disposed on the first interlayer insulating film, and
a contact plug disposed in the second interlayer insulating film,
wherein the contact plug connects the wiring layer to the first semiconductor region.

* * * * *